United States Patent
Auchere et al.

(10) Patent No.: US 10,257,943 B2
(45) Date of Patent: Apr. 9, 2019

(54) ELECTRONIC DEVICE WITH INTEGRATED CIRCUIT CHIP PROVIDED WITH AN EXTERNAL ELECTRICAL CONNECTION NETWORK

(71) Applicant: STMicroelectronics (Grenoble 2) SAS, Grenoble (FR)

(72) Inventors: David Auchere, Meylan (FR); Laurent Marechal, Bures sur Yvette (FR)

(73) Assignee: STMICROELECTRONICS (GRENOVLE 2) SAS, Grenoble (FR)

(*) Notice: Subject to any disclaimer, the term of this patent is extended or adjusted under 35 U.S.C. 154(b) by 0 days.

(21) Appl. No.: 15/926,583

(22) Filed: Mar. 20, 2018

(65) Prior Publication Data
US 2018/0213654 A1    Jul. 26, 2018

Related U.S. Application Data

(62) Division of application No. 14/330,176, filed on Jul. 14, 2014, now Pat. No. 9,949,381.

(30) Foreign Application Priority Data

Jul. 15, 2013 (FR) .................... 13 56936

(51) Int. Cl.
H05K 1/18      (2006.01)
H05K 3/42      (2006.01)
H01L 23/64     (2006.01)
H01L 23/498    (2006.01)

(52) U.S. Cl.
CPC .......... *H05K 3/42* (2013.01); *H01L 23/49811* (2013.01); *H01L 23/49822* (2013.01); *H01L 23/49827* (2013.01); *H01L 23/645* (2013.01); *H01L 2224/16225* (2013.01); *H01L 2924/15311* (2013.01); *Y10T 29/4913* (2015.01)

(58) Field of Classification Search
CPC  H01L 23/50; H01L 23/5383; H01L 23/49838
USPC .................................................. 361/760–784
See application file for complete search history.

(56) References Cited

U.S. PATENT DOCUMENTS

| | | |
|---|---|---|
| 2,907,924 A | 10/1959 | Lutton |
| 6,218,729 B1 | 4/2001 | Zavrel, Jr. et al. |
| 6,310,386 B1 | 10/2001 | Shenoy |
| 6,362,525 B1 | 3/2002 | Rahim |
| 6,483,692 B2 | 11/2002 | Figueroa et al. |
| 6,636,416 B2 | 10/2003 | Li et al. |
| 6,713,860 B2 | 3/2004 | Li |
| 6,787,920 B2 | 9/2004 | Amir |
| 6,907,658 B2 | 6/2005 | Li |

(Continued)

FOREIGN PATENT DOCUMENTS

| | | |
|---|---|---|
| EP | 2290687 A1 | 3/2011 |
| WO | 0004595 A2 | 1/2000 |

(Continued)

*Primary Examiner* — Tuan T Dinh
(74) *Attorney, Agent, or Firm* — Slater Matsil, LLP

(57) ABSTRACT

An electronic device includes a substrate having an external surface, and an integrated circuit over the external surface of the substrate. The substrate is provided with an electrical connection network including electrical links for linking the integrated circuit to another electrical device. Some of the electrical links include an impedance-compensating inductor on an external surface of the substrate.

19 Claims, 2 Drawing Sheets

(56) References Cited

U.S. PATENT DOCUMENTS

| | | | |
|---|---|---|---|
| 7,358,607 B2 | 4/2008 | Figueroa et al. | |
| 7,544,064 B2 | 6/2009 | Gilliland | |
| 7,859,080 B2 * | 12/2010 | Kuwajima | H01G 4/33 257/275 |
| 8,227,706 B2 * | 7/2012 | Roy | H05K 1/0222 174/262 |
| 8,821,188 B2 | 9/2014 | Chang et al. | |
| 2003/0052077 A1 * | 3/2003 | Hanhikorpi | G08B 13/2414 216/2 |
| 2005/0178582 A1 | 8/2005 | Lee et al. | |
| 2005/0212134 A1 | 9/2005 | Pu | |
| 2005/0218516 A1 | 10/2005 | Lloyd et al. | |
| 2006/0055049 A1 | 3/2006 | Nelson et al. | |
| 2006/0180905 A1 | 8/2006 | Zeng et al. | |
| 2008/0129394 A1 | 6/2008 | Kissing et al. | |
| 2008/0157295 A1 | 7/2008 | Nuytkens et al. | |
| 2008/0202799 A1 | 8/2008 | Graydon et al. | |
| 2009/0079530 A1 | 3/2009 | Chandrasekhar et al. | |
| 2009/0215287 A1 | 8/2009 | Mori et al. | |
| 2010/0096725 A1 | 4/2010 | Shi et al. | |
| 2010/0246149 A1 | 9/2010 | Nakashima et al. | |
| 2011/0085311 A1 | 4/2011 | Chen | |
| 2011/0188193 A1 | 8/2011 | Yi | |
| 2011/0273240 A1 | 11/2011 | Lin | |
| 2012/0037411 A1 | 2/2012 | Hsu et al. | |
| 2013/0208434 A1 | 8/2013 | Alm | |

FOREIGN PATENT DOCUMENTS

| | | | |
|---|---|---|---|
| WO | 2007114224 A1 | 10/2007 | |
| WO | 2008097911 A1 | 8/2008 | |

\* cited by examiner

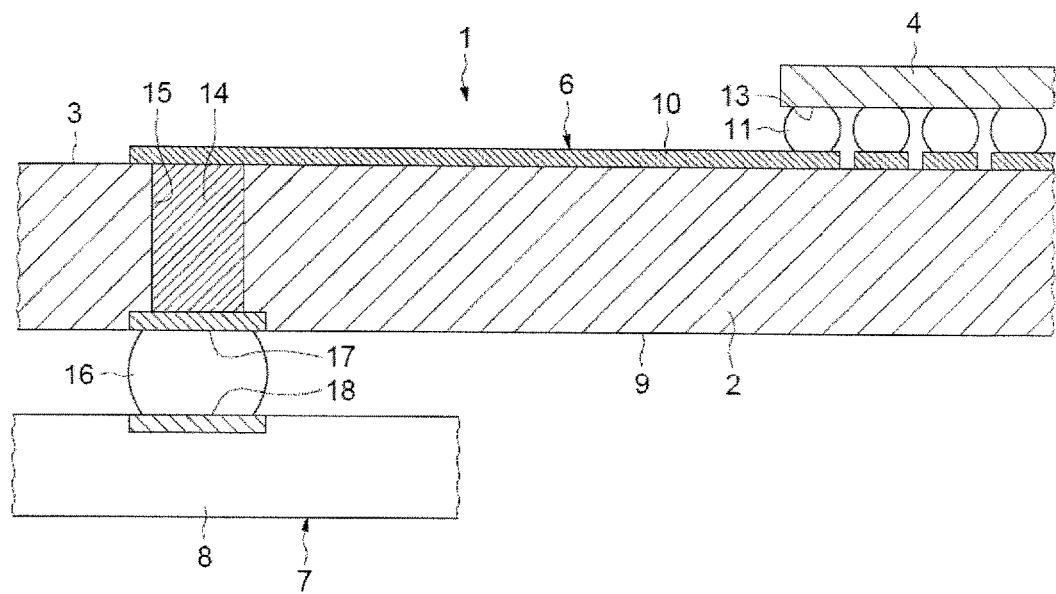
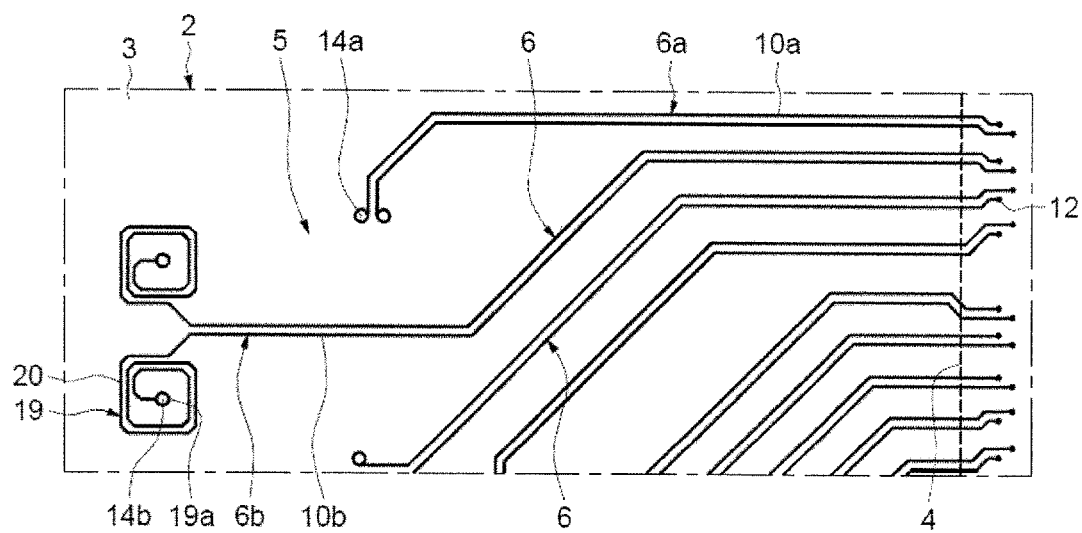

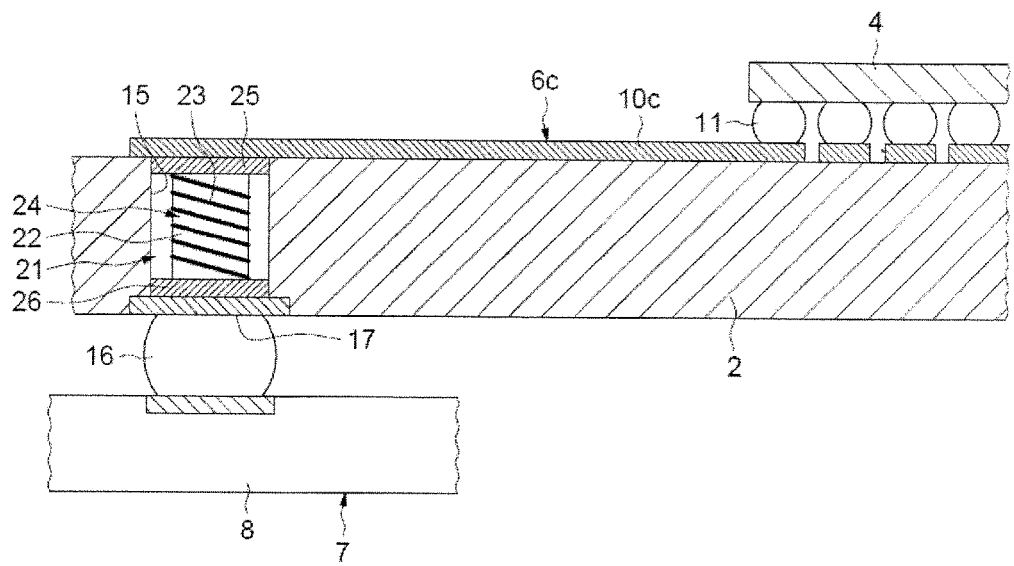
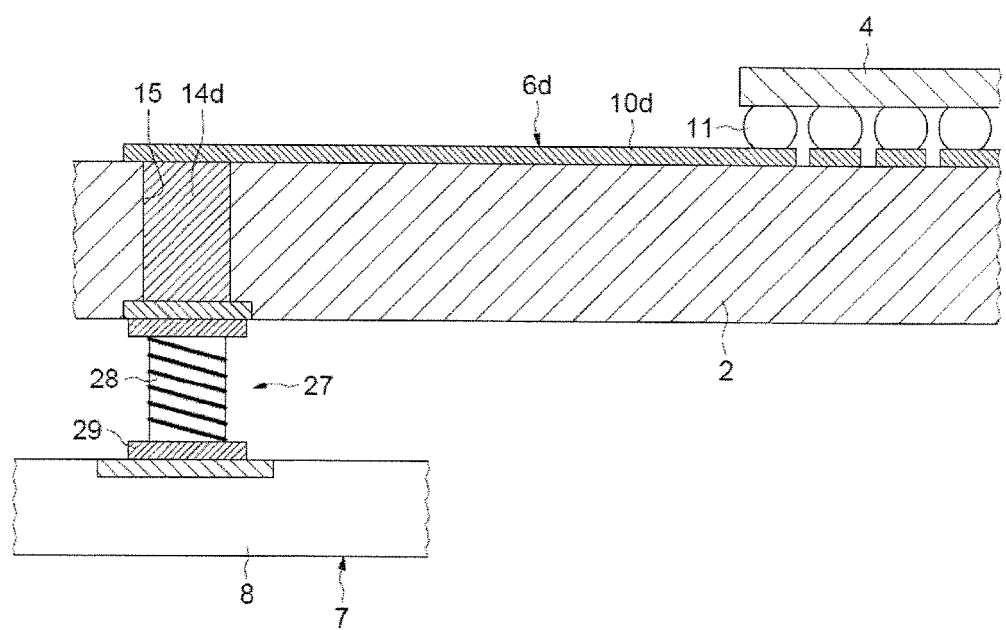

ELECTRONIC DEVICE WITH INTEGRATED CIRCUIT CHIP PROVIDED WITH AN EXTERNAL ELECTRICAL CONNECTION NETWORK

CROSS-REFERENCE TO RELATED APPLICATIONS

This application is a divisional of U.S. application Ser. No. 14/330,176, filed on Jul. 14, 2014, which application claims the priority to French Application No. 1356936, filed Jul. 15, 2013, which applications are hereby incorporated herein by reference.

TECHNICAL FIELD

The present disclosure relates to the field of electronic devices including integrated circuits and related methods.

BACKGROUND

Generally, an electrical connection network comprises electrical connection tracks (i.e. traces) linked to the integrated circuit chip, for example, by way of electrical connection beads (balls) or columns (vias). When the printed circuit board is placed on the other side of the substrate board bearing the integrated circuit chip, the traces are linked to the printed circuit board by way of electrical connection vias passing through the substrate board and of electrical connection beads or columns.

When the printed circuit board is placed on the same side of the substrate board as the integrated circuit chip, the electrical connection traces are directly linked to the printed circuit board by way of electrical connection beads or columns. In the case where electrical connection traces are used for the transfer of high-frequency digital signals, which are required to have ever sharper edges, the above devices may degrade digital signals.

SUMMARY

The present disclosure may improve electrical links between integrated circuit chips carried by substrates and other electric devices.

An electronic device may comprise a substrate, and at least one integrated circuit assembled on the substrate. The substrate may be provided with an electrical connection network comprising a plurality of electrical links for linking the integrated circuit to another electric device, and in which at least one of the electrical links comprises at least one impedance-compensating inductor.

The electrical link may comprise an electrical connection trace and an external electrical connection element, the inductor being placed between this trace and this element. The inductor may comprise a coil formed flat onto the substrate board and around an electrical connection region. The electrical connection region may be placed at one end of an electrical connection via passing through the substrate board. The inductor may be incorporated into a specific attached electrical connection component, for example, inserted in a through-passageway of the substrate board. The electrical link may comprise a transmission line for high-frequency digital signals.

BRIEF DESCRIPTION OF THE DRAWINGS

Some electronic devices will now be described by way of non-limiting examples, illustrated by the drawing in which:

FIG. 1 is a schematic diagram of a cross-sectional view of an assembly of an electronic device;

FIG. 2 is a top plan view of a substrate of the electronic device in FIG. 1;

FIG. 3 is a schematic diagram of a cross-sectional view of another embodiment of the electronic device; and FIG. 4 is a schematic diagram of a cross-sectional view of another embodiment of the electronic device.

DETAILED DESCRIPTION OF ILLUSTRATIVE EMBODIMENTS

An electronic device 1 shown in FIGS. 1 and 2 comprises a substrate board (i.e. substrate) 2 made of an insulating material, which is provided, above a front face 3, with an integrated circuit chip 4. The substrate board 2 is provided with an electrical connection (i.e. electrical interconnect) network 5 comprising a plurality of electrical links 6 enabling the chip 4 to be linked to another electronic device 7, which comprises, for example, a printed circuit board 8 placed above a back face 9 of the substrate board opposite its front face 3.

Each electrical link 6 comprises an electrical connection trace 10 arranged on the front face 3 of the substrate board 2 and an electrical connection element 11, such as a bead, interposed between a front contact region 12 provided at one end 11 of the electrical connection trace 10 and a contact region 13 of the chip 4. Each electrical link 6 further comprises an electrical connection via 14 arranged in a passageway 15 passing through the substrate board 2, made of an electrically conductive material at least partly filling the passageway 15, and an external electrical connection element 16, such as a bead, interposed between a back contact region 17 provided on a back face of the electrical connection via 14 and a contact region 18 of the printed circuit board 8.

The plurality of electrical links 6 is divided into two groups of electrical links 6a and 6b. In the first group of electrical links 6a, the other end of the electrical connection trace 10a of each electrical link is directly linked to the corresponding electrical connection via 14a. In the second group of electrical links 6b, the other end of the electrical connection trace 10b of each electrical link is linked to the corresponding electrical connection via 14b by way of an impedance-compensating inductor 19, which comprises a coil 20 arranged on the front face 3 of the substrate board 2, which is formed at the same time as the electrical connection trace 10b and around an electrical connection region 19a placed on one end of the electrical connection via 14b.

The electrical links 6b can be specifically assigned to the transmission, in one direction and/or the other, of high-frequency signals, for example, video signals. The presence in these links 6b of the inductors 19, arranged as close as possible to the electrical connection vias 14, makes it possible to compensate for the drops in impedance due, in particular, to the existence of the electrical connection vias 14 and the electrical connection elements 16, by raising them in such a way that the values of the impedances in the electrical links 6b are, for example, above a determined threshold.

In another embodiment illustrated in FIG. 3, each electrical link of a group of electrical links 6c, equivalent to those of the group of electrical links 6b but without the presence of the inductor 19, comprises a specific electrical connection component 21 inserted in the through-passageway 15 of the substrate board 2, in place of the corresponding electrical connection via.

The specific electrical connection component 21, which can be of CMS or surface mount device (SMD) type, can comprise, in an embodiment, a cylindrical base 22 that bears, on its periphery, a wire coil 23 forming an impedance-compensating inductor 24 and comprises a front electrical connection pad 25 and a back electrical connection pad 26 which are linked to the ends of the inductor 24. This specific attached component could have a different structure.

Each electrical link 6c comprises an electrical connection trace 10c, which is linked directly to the front electrical connection pad 25 of the specific electrical connection component 21. Whereas, the back electrical connection pad 26 is linked to a back contact region 17, on which an electrical connection element 16 such as a bead is placed.

In another embodiment illustrated in FIG. 4, each electrical link of a group of electrical links 6d, equivalent to those of the group of electrical links 6b but also without the presence of the inductor 19, comprises an electrical connection via 14d, an electrical connection trace 10d linked directly to this via 14d, and a specific external electrical connection component 27, equivalent to the specific component 21, set out and attached in place of the corresponding external electrical connection back element. The specific electrical connection component 27 comprises an impedance-compensating inductor coil 28, linked to opposing electrical connection pads 29 and 30, the latter being linked to the electrical connection via 14d passing through the substrate board 2 and to the printed circuit board 8 respectively.

In another embodiment, the printed circuit board 8 could be placed on the same side of the substrate board 2 as the integrated circuit chip 4. In this case, the electrical connection vias 14 would be dispensed with and the electrical links would comprise electrical connection elements between the front face 3 of the substrate board 2 and the printed circuit board 8, either by electrical connection elements, such as beads, placed on the electrical connection regions 19a when an inductor equivalent to the inductor 9 was provided, or by specific components forming inductors equivalent to the specific components 27. The present embodiments are not limited to the examples described above. Other variants and other embodiments are possible without departing from the context of the present disclosure.

What is claimed is:

1. An electronic device, comprising:
a substrate having a first major surface and a second major surface opposite the first major surface;
an electrically conductive trace contacting the first major surface of the substrate;
an integrated circuit (IC) chip electrically coupled to a first end of the electrically conductive trace by an external electrically conductive element disposed between the IC chip and the first end of the electrically conductive trace, wherein the electrically conductive trace extends away from a masking area of the IC chip to a second end of the electrically conductive trace; and
an impedance-compensating inductor located outside the masking area of the IC chip, the impedance-compensating inductor extending through a thickness of the substrate, the impedance-compensating inductor comprising a wire coil that is coiled around a base element, the wire coil having a first end electrically coupled to the second end of the electrically conductive trace, the wire coil further having a second end electrically coupled to a back contact located at the second major surface of the substrate.

2. The electronic device of claim 1, further comprising a front electrical connection pad electrically coupled between the second end of the electrically conductive trace and the first end of the wire coil.

3. The electronic device of claim 1, further comprising a back electrical connection pad electrically coupled between the second end of the wire coil and the back contact.

4. The electronic device of claim 1, wherein the substrate comprises a dielectric layer.

5. The electronic device of claim 1, wherein the electrically conductive trace comprises a transmission line for a high-frequency signal.

6. The electronic device of claim 2, wherein a major surface of the front electrical connection pad facing away from the wire coil is coplanar with the first major surface of the substrate.

7. The electronic device of claim 3, wherein a major surface of the back contact facing away from the wire coil is coplanar with the second major surface of the substrate.

8. The electronic device of claim 6, wherein the second end of the electrically conductive trace physically contacts the major surface of the front electrical connection pad.

9. An electronic device assembly, comprising:
a first electronic device, comprising:
a substrate having a first major surface and a second major surface opposite the first major surface;
an electrically conductive trace extending across at least a portion of the first major surface of the substrate, the electrically conductive trace comprising a first end and a second end opposite the first end;
an integrated circuit (IC) chip electrically coupled to the first end of the electrically conductive trace by a first external electrically conductive element disposed between the IC chip and the first end of the electrically conductive trace, wherein the first end of the electrically conductive trace is located within a masking area of the IC chip, and wherein the second end of the electrically conductive trace is located outside the masking area of the IC chip; and
an impedance-compensating inductor located outside the masking area of the IC chip, the impedance-compensating inductor being disposed in a passageway extending through a thickness of the substrate, the impedance-compensating inductor comprising a wire coil that is coiled around a base element disposed in the passageway, the wire coil having a first end electrically coupled to the second end of the electrically conductive trace, the wire coil further having a second end electrically coupled to a back contact located at the second major surface of the substrate; and
a second electronic device electrically coupled to the back contact by a second external electrically conductive element located between the second electronic device and the back contact.

10. The electronic device assembly of claim 9, further comprising a front electrical connection pad electrically coupled between the second end of the electrically conductive trace and the first end of the wire coil.

11. The electronic device assembly of claim 9, further comprising a back electrical connection pad electrically coupled between the second end of the wire coil and the back contact.

12. The electronic device assembly of claim 9, wherein the substrate comprises a dielectric layer.

13. The electronic device assembly of claim 9, wherein the electrically conductive trace comprises a transmission line for a high-frequency signal.

14. The electronic device assembly of claim 10, wherein a major surface of the front electrical connection pad facing away from the wire coil is coplanar with the first major surface of the substrate.

15. The electronic device assembly of claim 11, wherein a major surface of the back contact facing away from the wire coil is coplanar with the second major surface of the substrate.

16. The electronic device assembly of claim 14, wherein the second end of the electrically conductive trace physically contacts the major surface of the front electrical connection pad.

17. An electronic device, comprising:
   a substrate having a first external surface and a second external surface opposite the first external surface;
   an electrically conductive trace extending across at least a portion of the first external surface of the substrate, the electrically conductive trace comprising a first end and a second end opposite the first end;
   an integrated circuit (IC) chip electrically coupled to the first end of the electrically conductive trace by a first external electrically conductive element disposed between the IC chip and the first end of the electrically conductive trace, wherein the first end of the electrically conductive trace is located within a masking area of the IC chip, and wherein the second end of the electrically conductive trace is located outside the masking area of the IC chip;
   an electrically conductive via extending through a thickness of the substrate, the electrically conductive via having a first end physically contacting an undersurface of the first end of the electrically conductive trace; and
   a second external electrically conductive element located outside the substrate and at the second external surface of the substrate, the second external electrically conductive element being electrically coupled to a second end of the electrically conductive via opposite the first end of the electrically conductive via, the second external electrically conductive element comprising:
      an impedance-compensating inductor located outside the masking area of the IC chip, the impedance-compensating inductor comprising a wire coil that is coiled around a base element.

18. The electronic device of claim 17, wherein the electrically conductive trace comprises a transmission line for a high-frequency signal.

19. The electronic device of claim 17, wherein the substrate comprises a dielectric layer.

* * * * *

UNITED STATES PATENT AND TRADEMARK OFFICE
CERTIFICATE OF CORRECTION

PATENT NO. : 10,257,943 B2
APPLICATION NO. : 15/926583
DATED : April 9, 2019
INVENTOR(S) : David Auchere Page 1 of 1

It is certified that error appears in the above-identified patent and that said Letters Patent is hereby corrected as shown below:

On the Title Page

Item (73) Assignee, Line 2, delete "(GRENOVLE 2)" and insert --(GRENOBLE 2)--.

Signed and Sealed this
Twenty-fifth Day of June, 2019

Andrei Iancu
*Director of the United States Patent and Trademark Office*